United States Patent
Petrie et al.

(10) Patent No.: US 10,692,362 B2
(45) Date of Patent: *Jun. 23, 2020

(54) SYSTEMS AND METHODS FOR COMPARING SIGNAL CHANNELS HAVING DIFFERENT COMMON MODE TRANSIENT IMMUNITY

(71) Applicant: Allegro MicroSystems, LLC, Manchester, NH (US)

(72) Inventors: Craig S. Petrie, Merrimack, NH (US); Akshay Pai, Nashua, NH (US); David J. Haas, Concord, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/516,600

(22) Filed: Jul. 19, 2019

(65) Prior Publication Data
US 2019/0362619 A1 Nov. 28, 2019

Related U.S. Application Data

(63) Continuation-in-part of application No. 15/622,459, filed on Jun. 14, 2017, now Pat. No. 10,380,879.

(51) Int. Cl.
*G06F 11/00* (2006.01)
*G08B 29/14* (2006.01)
(Continued)

(52) U.S. Cl.
CPC .............. *G08B 29/14* (2013.01); *G01D 3/08* (2013.01); *G01R 31/2829* (2013.01); *G01R 33/0023* (2013.01); *G08B 21/182* (2013.01)

(58) Field of Classification Search
CPC .... G08B 29/14; G08B 21/182; G08B 29/185; G01R 33/07; G01R 33/09; H04L 25/4902
See application file for complete search history.

(56) References Cited

U.S. PATENT DOCUMENTS 5,592,058 A 1/1997 Archer et al.
6,373,307 B1 * 4/2002 Takai ................... G11C 7/1051
327/141
(Continued)

FOREIGN PATENT DOCUMENTS

CN 105634361 A 6/2016
EP 0 848 489 A2 6/1998
(Continued)

OTHER PUBLICATIONS

Office Action dated Oct. 10, 2019 for U.S. Appl. No. 16/444,347; 6 pages.
(Continued)

*Primary Examiner* — Munear T Akki
(74) *Attorney, Agent, or Firm* — Daly, Crowley, Mofford & Durkee, LLP

(57) ABSTRACT

A sensor integrated circuit includes a main processing channel that responds to an input signal by generating a first processed signal from the input signal. Also included is a diagnostic processing channel that responds to the input signal by generating a second processed signal from the input signal. The main processing channel has a first response to disturbances and the diagnostic processing channel has a second response to disturbances that is slower than the first response of the main processing channel. A checker circuit in the sensor integrated circuit detects faults in the sensor IC and generates a fault signal when the first processed signal and the second processed signal differ from each other by more than a threshold amount.

30 Claims, 9 Drawing Sheets

(51) Int. Cl.
*G01D 3/08* (2006.01)
*G01R 31/28* (2006.01)
*G08B 21/18* (2006.01)
*G01R 33/00* (2006.01)

(56) References Cited

U.S. PATENT DOCUMENTS

| | | | |
|---|---|---|---|
| 7,772,838 | B2 | 8/2010 | Bailey et al. |
| 8,280,568 | B2 | 10/2012 | Nakatsu et al. |
| 8,917,043 | B2 | 12/2014 | Reynolds et al. |
| 8,917,044 | B2 | 12/2014 | Reynolds et al. |
| 9,194,884 | B1 | 11/2015 | Mossman et al. |
| 9,329,057 | B2 | 5/2016 | Foletto et al. |
| 9,411,023 | B2 | 8/2016 | Friedrich et al. |
| 9,780,706 | B2 | 10/2017 | Allegrini et al. |
| 9,887,653 | B2 | 2/2018 | Ross et al. |
| 10,380,879 | B2 | 8/2019 | Haas et al. |
| 2003/0001537 | A1 | 1/2003 | Yang et al. |
| 2003/0070126 | A1 | 4/2003 | Werner et al. |
| 2003/0127289 | A1 | 7/2003 | Elgas et al. |
| 2005/0007044 | A1 | 1/2005 | Qiu et al. |
| 2006/0195720 | A1* | 8/2006 | Watts .......... H03F 1/52 714/11 |
| 2007/0001629 | A1 | 1/2007 | McGarry et al. |
| 2011/0062909 | A1 | 3/2011 | Patel et al. |
| 2012/0074972 | A1 | 3/2012 | Rasbornig et al. |
| 2012/0211299 | A1 | 8/2012 | Yanai |
| 2013/0106340 | A1 | 5/2013 | Chabaud et al. |
| 2013/0200909 | A1 | 8/2013 | Rasbornig et al. |
| 2013/0249544 | A1* | 9/2013 | Vig .......... G01R 33/0011 324/252 |
| 2014/0028237 | A1 | 1/2014 | Park et al. |
| 2014/0184200 | A1 | 7/2014 | Milano et al. |
| 2014/0285124 | A1 | 9/2014 | Derammelaere et al. |
| 2014/0333241 | A1 | 11/2014 | Zhao et al. |
| 2015/0015241 | A1 | 1/2015 | Tamura |
| 2015/0185279 | A1 | 7/2015 | Milano et al. |
| 2015/0185284 | A1 | 7/2015 | Milano et al. |
| 2015/0185293 | A1 | 7/2015 | Milano et al. |
| 2015/0241523 | A1 | 8/2015 | Scherr |
| 2015/0354985 | A1 | 12/2015 | Judkins, III et al. |
| 2016/0025820 | A1 | 1/2016 | Scheller et al. |
| 2016/0139199 | A1 | 5/2016 | Petrie et al. |
| 2016/0139229 | A1 | 5/2016 | Petrie et al. |
| 2017/0052208 | A1 | 2/2017 | Reddy et al. |
| 2017/0110652 | A1 | 4/2017 | Doogue et al. |
| 2018/0367073 | A1 | 12/2018 | Haas |

FOREIGN PATENT DOCUMENTS

| | | |
|---|---|---|
| JP | H 03231317 A | 10/1991 |
| JP | 2006/067667 A | 3/2006 |
| JP | 2010/045914 A | 2/2010 |
| KR | 101394556 B1 | 5/2014 |

OTHER PUBLICATIONS

U.S. Final Office Action dated Jun. 27, 2019 for U.S. Appl. No. 15/697,846; 18 Pages.
Response to U.S. Office Action dated Mar. 8, 2019 for U.S. Appl. No. 15/697,846; Response filed on Jun. 6, 2019; 13 Pages.
Notice of Allowance dated Jan. 13, 2020 for U.S. Appl. No. 16/444,347; 8 pages.
Office Action dated Oct. 2, 2019 for U.S. Appl. No. 15/697,846; 20 pages.
Response to Office Action filed Jan. 27, 2020 for U.S. Appl. No. 15/697,846; 14 pages.
Notice of Allowance dated Feb. 6, 2020 for U.S. Appl. No. 16/695,698; 8 pages.
U.S. Appl. No. 16/365,855, filed Mar. 27, 2019, Daubert et al.
U.S. Appl. No. 16/511,104, filed Jul. 15, 2019, Petrie et al.
Emadi, McMaster University "Advanced Electric Drive Vehicles", 2015, 3 pages.
Extended European Search Report dated Jan. 23, 2019 for European Application No. 18192781.5; 8 Pages.
Extended European Search Report dated Oct. 4, 2018 for European Application No. 18176741.9; 7 Pages.
International Standard ISO 26262-1 "Road Vehicles—Functional Safety—Part 1 Vocabulary", Nov. 15, 2011, 30 pages.
International Standard ISO 26262-5 "Road Vehicles—Functional Safety—Part 5 Product development at the hardware level", Nov. 15, 2011, 86 pages.
International Standard ISO 26262-9 "Road Vehicles—Functional Safety—Part 9 Automotive Safety Integrity Level (ASIL)-oriented and safety-oriented analyses", Nov. 15, 2011, 24 pages.
Microchip WebSeminars "Sensorless Field Oriented Control (FOC) for Permanent Magnet Synchronous Motors (PMSM)", 51 pages.
Non-Final Office Action dated Mar. 8, 2019 for U.S. Appl. No. 15/697,846; 19 Pages.
Restriction Requirement dated Apr. 6, 2018 for U.S. Appl. No. 15/622,459, 5 pages.
Response to Restriction Requirement and Preliminary Amendment filed Jun. 1, 2018 for U.S. Appl. No. 15/622,459, 10 pages.
Office Action dated Sep. 17, 2018 for U.S. Appl. No. 15/622,459, 11 pages.
Response to Office Action filed Dec. 10, 2018 for U.S. Appl. No. 15/622,459, 14 pages.
Notice of Allowance dated Mar. 18, 2019 for U.S. Appl. No. 15/622,459; 10 pages.
Response to Office Action filed Jun. 27, 2019 for European Application No. 18176741.9; 68 pages.
Final Office Action dated Jun. 27, 2019, for U.S. Appl. No. 15/697,846; 18 pages.
Response to Final Office Action and Request for Continued Examination filed Sep. 6, 2019, for U.S. Appl. No. 15/697,846; 17 pages.
Response to Office Action filed Sep. 13, 2019 for European Application No. 18192781.5; 18 pages.
Terminal Disclaimer dated Dec. 10, 2019 for U.S. Appl. No. 16/444,347; 3 pages.
Response to Office Action dated Dec. 11, 2019 for U.S. Appl. No. 16/444,347; 10 pages.
U.S. Appl. No. 16/695,698, filed Nov. 26, 2019, Haas et al.

* cited by examiner

SYSTEMS AND METHODS FOR COMPARING SIGNAL CHANNELS HAVING DIFFERENT COMMON MODE TRANSIENT IMMUNITY

RELATED APPLICATIONS

This application is a continuation-in-part of and claims priority to and the benefit of U.S. patent application Ser. No. 15/622,459, entitled "Sensor Integrated Circuits and Methods for Safety Critical Applications" and filed on Jun. 14, 2017, the entirety of which is hereby incorporated by reference.

BACKGROUND

Sensor integrated circuits are widely used in automobile control systems and other safety critical applications. Vehicle safety standards such as ISO 26262 and its Automotive Safety Integrity Level (ASIL) safety classification standard, set forth requirements related to permissible sensor quality levels, failure rates, and overall functional safety. One approach to meeting such mandates has been to use redundant identical circuits in a sensor integrated circuit.

In-phase current sensor integrated circuits used in motor control systems often implement redundancy using redundant signal processing channels such as a first main channel and a second diagnostic channel. During operation of the motor control system, output of the main channel is compared to output of the diagnostic channel to ensure that both outputs are similar. A failure in the main channel is detected by this comparison and communicated to the system controller of the motor control system. The system controller responds to the failure in any number of ways such as by permitting the motor control system to enter a safe state despite the failure.

SUMMARY

The systems and methods described herein implement a cost-effective ASIL-compliant system that has a diagnostic processing channel with one set of common mode transient immunity (CMTI) requirements that can be used to detect faults in a main processing channel with a more robust set of CMTI requirements. In these systems and methods, comparing the signals processed in the two channels with different common mode requirements includes using one or more comparison methods that minimize the impact that disturbances in the diagnostic processing channel signal have on the comparison of the two signals, where the disturbances are caused by common mode transient voltages that are not rejected by the diagnostic processing channel because of its lower CMTI requirements.

Described is a sensor integrated circuit that includes a main processing channel that responds to an input signal to generate a first processed signal and has a first response to disturbances. Also included in the sensor integrated circuit is a diagnostic processing channel that responds to the input signal to generate a second processed signal and has a second response to disturbances larger than the first response. A checker circuit is configured to respond to the first processed signal and the second processed signal by detecting a fault in the sensor integrated circuit and generating a fault signal that indicates the fault, when the first processed signal and the second processed signal differ from each other by more than a predetermined amount. In some embodiments, the disturbances include common mode input changes.

The sensor integrated circuit can include a sensing element that is configured to sense a parameter and generate the input signal that is coupled to the main processing channel and to the diagnostic processing channel. This sensing element can include a resistor and the parameter can be a current.

In some instances, the main processing channel has a first latency, and the diagnostic processing channel has a second latency that is greater than the first latency. In other instances, the main processing channel has a first latency, and the diagnostic processing channel has a second latency that is substantially similar to the first latency.

The input signal can be an analog signal, the main processing channel can include a first analog-to-digital converter that is configured to convert the analog signal into a first digital signal and the diagnostic processing channel can include a second analog-to-digital converter that is configured to convert the analog signal into a second digital signal. In some embodiments, the checker circuit can include a first sample circuit that is configured to sample the first digital signal and generate a first sampled signal, a second sample circuit that is configured to process the second digital signal and generate a second sampled signal, and a comparator that is configured to compare the first sampled signal to the second sampled signal.

A comparator can be configured to determine, within a predetermined window of time, whether an absolute difference between the second sampled signal and the first sampled signal exceeds a difference threshold. The checker circuit can include an error counter that increments each time the absolute difference exceeds the difference threshold, and outputs the fault signal when the error counter exceeds an error threshold. In some embodiments, the predetermined windows of time, the difference threshold, or the error threshold are programmable based on an expected level of the disturbances.

The checker circuit can include a counter that increments each time the absolute difference falls below the difference threshold, and outputs a fault signal when the counter fails to exceed a threshold. In other embodiments, the checker circuit can include an error counter that increments each consecutive time the absolute difference exceeds the difference threshold, and outputs the fault signal until the error counter exceeds an error threshold.

In embodiments, the comparator can be configured to suspend determining whether the absolute difference between the second sampled signal and the first sampled signal exceeds the difference threshold during a blanking period. The blanking period can be established based on a voltage level of the input signal. In these embodiments, the sensor integrated circuit can include an input signal indictor that is configured to provide an indication of edges of the input signal, and a blanking counter that is configured to increment in response to the edge indication. The blanking period can commence in response to detection of a predetermined number of edge indications. In some instances, the input signal indicator can include an edge detector coupled to receive the input signal and configured to detect edges of the input signal to provide the indication, and external signal, or the second processed signal.

In other embodiments, the checker circuit can be configured to suspend generating the second sampled signal and to hold a value of the second sampled signal during a hold period. In these embodiments, the comparator can be configured to determine, during the hold period, whether an absolute difference between the held value of the second sampled signal and the first sampled signal exceeds a difference threshold. The sensor integrated circuit, in these embodiments, can include an input signal indictor that is configured to provide an indication of edges of the input signal, and a holding counter that is configured to increment in response to the edge indication. The hold period can end in response to detection of a predetermined number of edge indications. In some instances, the input signal indicator can include an edge detector coupled to receive the input signal and configured to detect edges of the input signal to provide the indication, and external signal, or the second processed signal.

Also described is a method for detecting a fault in a sensor integrated circuit by generating, by a main processing channel, a first processed signal in response to an input signal, and generating, by a diagnostic processing channel, a second processed signal in response to the input signal. The method further includes detecting a fault in the sensor integrated circuit responsive to the first processed signal and the second processed signal and generating a fault signal when the first processed signal and the second processed signal differ from each other by more than a predetermined amount. In some instances, the method includes generating by a main processing channel that has a first response to common mode input changes and generating by a diagnostic processing channel further that has a second response to common mode input changes that is larger than the first response.

The method further includes detecting the fault and generating the fault signal using a checker circuit. In some instances, the method can include converting an analog signal input into the main processing channel to a first digital signal and converting an analog signal input into the diagnostic processing channel to a second digital signal. The checker circuit can sample the first digital signal to generate a first sampled signal, and the second digital signal to generate a second sampled signal. The first digital signal is compared to the second digital signal to generate the fault signal.

In some instances, during a predetermined window of time, the method includes determining whether an absolute difference between the second sampled signal and the first sampled signal exceeds a difference threshold, incrementing an error counter each time the absolute difference exceeds the difference threshold and outputting the fault signal when the error counter exceeds an error threshold. The method includes suspending determination of whether the absolute difference between the second sampled signal and the first sampled signal exceeds the difference threshold during a blanking period.

In some embodiments, the method includes suspending generating the second sampled signal and holding a value of the second sampled signal during a hold period and determining during the hold period whether an absolute difference between the held value of the second sampled signal and the first sampled signal exceeds a difference threshold. The hold period can correspond to a predetermined number of edge indications that are provided by an input signal indicator.

Also described herein is a sensor integrated circuit that includes a means for generating a first processed signal responsive to an input signal provided to a main processing channel and a means for generating a second processed signal responsive to the input signal provided to a diagnostic processing channel. The sensor integrated circuit can further include a means for detecting a fault in the sensor integrated circuit in response to the first processed signal and the second processed signal, a means for generating a fault signal indicative of the fault when the first processed signal and the second processed signal differ from each other by more than a predetermined amount.

BRIEF DESCRIPTION OF THE DRAWINGS

The foregoing and other objects, features and advantages will be apparent from the following more particular description of the embodiments and the appended claims, as illustrated in the accompanying drawings in which like reference characters refer to the same parts throughout the detailed description. Reference characters introduced in a figure may be repeated in one or more subsequent figures without additional description in the detailed description in order to provide context for other features of the described embodiments.

DETAILED DESCRIPTION

As used herein "common mode transient immunity" (CMTI) is the maximum tolerable rate of the rise and fall of the common mode voltage of a differential signal applied to an electronic circuit. When an electronic circuit has a high CMTI, the circuit is better able to reject the transient input common mode signal as the circuit processes a differential input signal.

Figure 1:
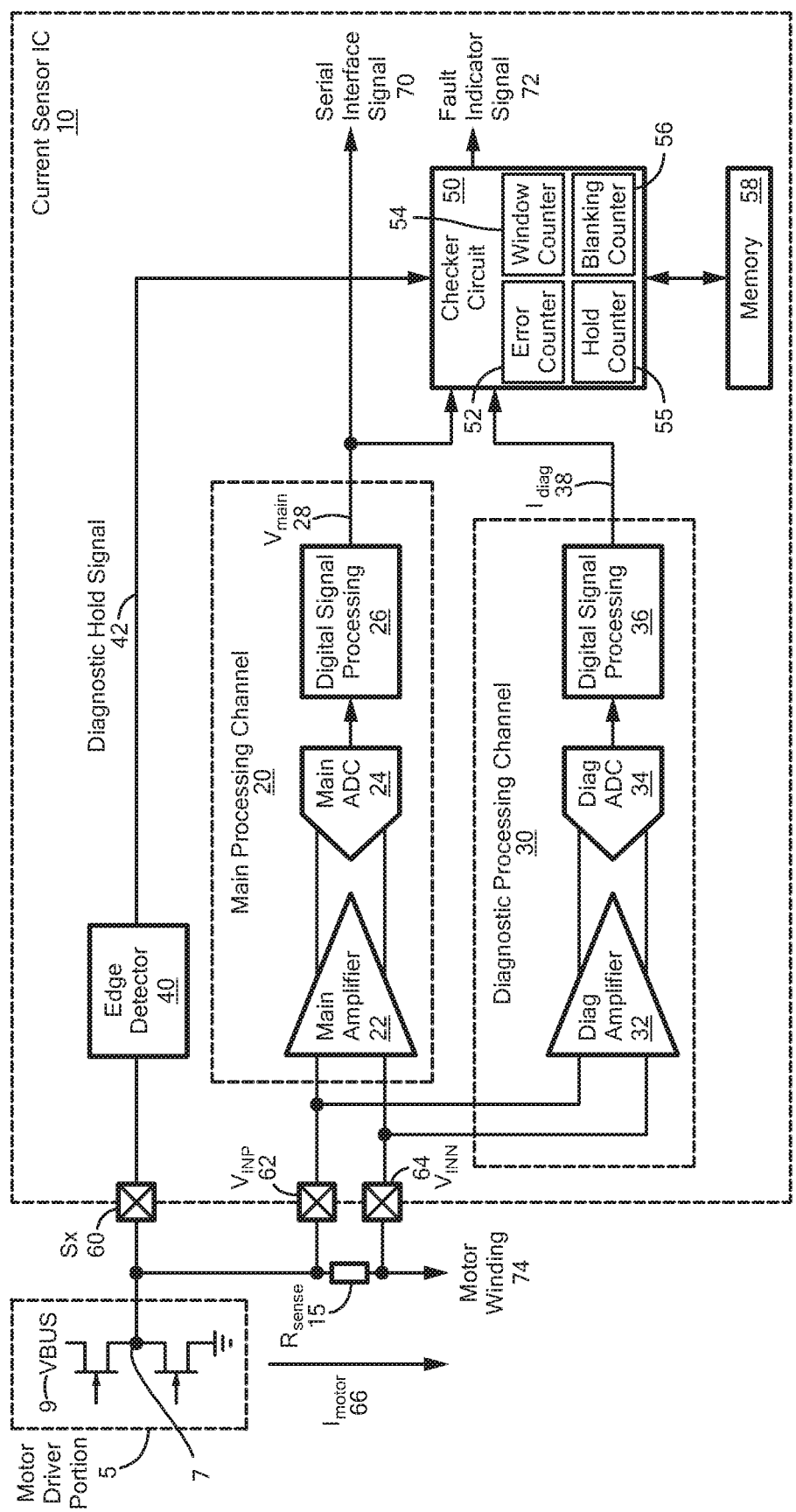
FIG. 1 illustrates a circuit diagram of a current sensor with a diagnostic processing channel and a checker circuit.

Illustrated in FIG. 1 is a current sensor integrated circuit 10 that includes a main processing channel 20 and a diagnostic processing channel 30 electrically connected to a checker circuit 50 that is further connected to a memory 58. Included in the current sensor IC 10 is an edge detector 40 that detects edges of a voltage at node Sx 60 and uses the sensed edges to generate a diagnostic hold signal 42 which is provided to the checker circuit 50. Node Sx 60 is electrically connected to a node 7 of a motor driver 5, a portion of which is shown. The motor driver 5 is configured to selectively couple motor windings (e.g., winding 74) to supply voltage terminals (e.g. VBUS 9 and GND) by applying PWM control signals to switches of the motor driver 5 to control the position of the motor's rotor. In an ideal system, the potential at node Sx 60 fluctuates between zero (0) volts and a VBUS 9 voltage of forty-eight (48) volts, however because the motor windings are inductive and the motor driver switches can transition rapidly, the actual potential at node Sx 60 can often exceed forty-eight (48) volts or fall below zero (0) volts. In some instances, the potential at node Sx 60 can dip as low as negative five (−5)

volts or negative fifteen (−15) volts and reach as high as eighty (80) volts. It should be appreciated that the motor driver input signal 5 can fluctuate within any logic voltage range.

A common mode transient voltage occurs when the potential at $V_{INP}$ 62 changes at the same time as the potential at $V_{INN}$ 64, and when the two potentials change the same amount. For example, a common mode transient voltage occurs when the potential at $V_{INP}$ 62 and $V_{INN}$ 64 changes (i.e. increases or decreases) five volts at time t while the differential signal between nodes VINP 62 and VINN 64 remains the same. It should be appreciated that common mode transient voltages can be any voltage value and common mode transient currents can be any current value. The common mode voltage is an average of input voltages while a differential voltage is the difference between input voltages. A differential signal path typically rejects common mode transient input signals, however in some instances the differential signal path cannot reject all common mode input signals therefore some common mode input signals are transmitted along with differential voltage signals. In some instances, common mode input signals can include common mode voltage signals and/or common mode current signals. The highly accurate sensor output signal, $I_{main}$ 28, of this system is typically processed to remove the common mode signals transmitted along with the differential signals.

Diagnostic processing channel 30 provides redundancy by responding to a differential input signal at nodes $V_{INP}$ 62 and $V_{INN}$ 64 by generating a second processed signal or comparison signal, $I_{diag}$ 38, against which the first processed signal, $I_{main}$ 28, generated by the main processing channel 20 is compared. To achieve the desired output signal $I_{main}$ 28 accuracy for the current sensor IC 10, the circuitry of the main processing channel 20 can be costly in terms of complexity, size and power dissipation of the main processing channel's circuitry. Implementing identical circuit architectures in both the main processing channel 20 and the diagnostic processing channel 30 can unnecessarily increase the cost of the current sensor IC 10. The level of accuracy required to detect a failure in the diagnostic processing channel 30 is typically less than the level of accuracy required to achieve the highly accurate sensor output signal $I_{main}$ 28 in main processing channel 20. The diagnostic processing channel 30 therefore does not need to have the same level of output signal accuracy as the main processing channel 20, and can be designed with less costly circuit components and operating requirements by simplifying the circuit architecture and relaxing certain performance metrics such as the diagnostic processing channel's diagnostic common-mode transient immunity (CMTI) in the presence of large common-mode transient signals at $R_{sense}$ 15. Once simplified, the diagnostic processing channel 30 responds to disturbances such as common mode input changes in a different manner than the manner in which the main processing channel 20 responds to the common mode input changes. In particular, the main processing channel 20 may not respond to a common mode change, or at the very least exhibit a small response to the common mode change, while the diagnostic processing channel 30 can exhibit a large and noticeable response to the common mode change. Thus, the main processing channel 20 can have a first response to common mode input changes while the diagnostic processing channel 30 can have a second response to common mode input changes that is larger than the main processing channel's first response. The diagnostic processing channel 30 can also have a latency that is greater than the latency of the main processing channel 20, or a latency that is substantially similar or equal to the latency of the main processing channel 20.

The processed signal, $I_{main}$ 28, is output as a signal 70 to a serial interface where it is interpreted as the motor current, $I_{motor}$ 66, therefore it is critical that any faults in the output signal 70 are flagged. The checker circuit 50 compares $I_{main}$ 28 and $I_{diag}$ 38, counts errors detected in $I_{main}$ 28, and upon receiving a certain number of errors, generates a fault indicator signal 72 that is transmitted to a separate safety system (not shown) and/or the motor driver (not shown). In some embodiments, the safety system can respond to receiving the fault indicator signal by transferring control of the motor to a backup motor control system when the fault indicator signal is asserted.

Difficulties arise when comparing $I_{main}$ 28 to $I_{diag}$ 38 because the diagnostic processing channel 30 has a relaxed and therefore lower common mode transient immunity (CMTI) than the main processing channel 20. The lower CMTI of the diagnostic processing channel 30 can result in a processed diagnostic signal, $I_{diag}$ 38, that has a larger number of disturbances and is therefore less accurate. The methods implemented by checker circuit 50 are designed to ignore the disturbances in the $I_{diag}$ 38 signal and count errors only when they occur in the $I_{main}$ 28 signal.

Figure 3A:
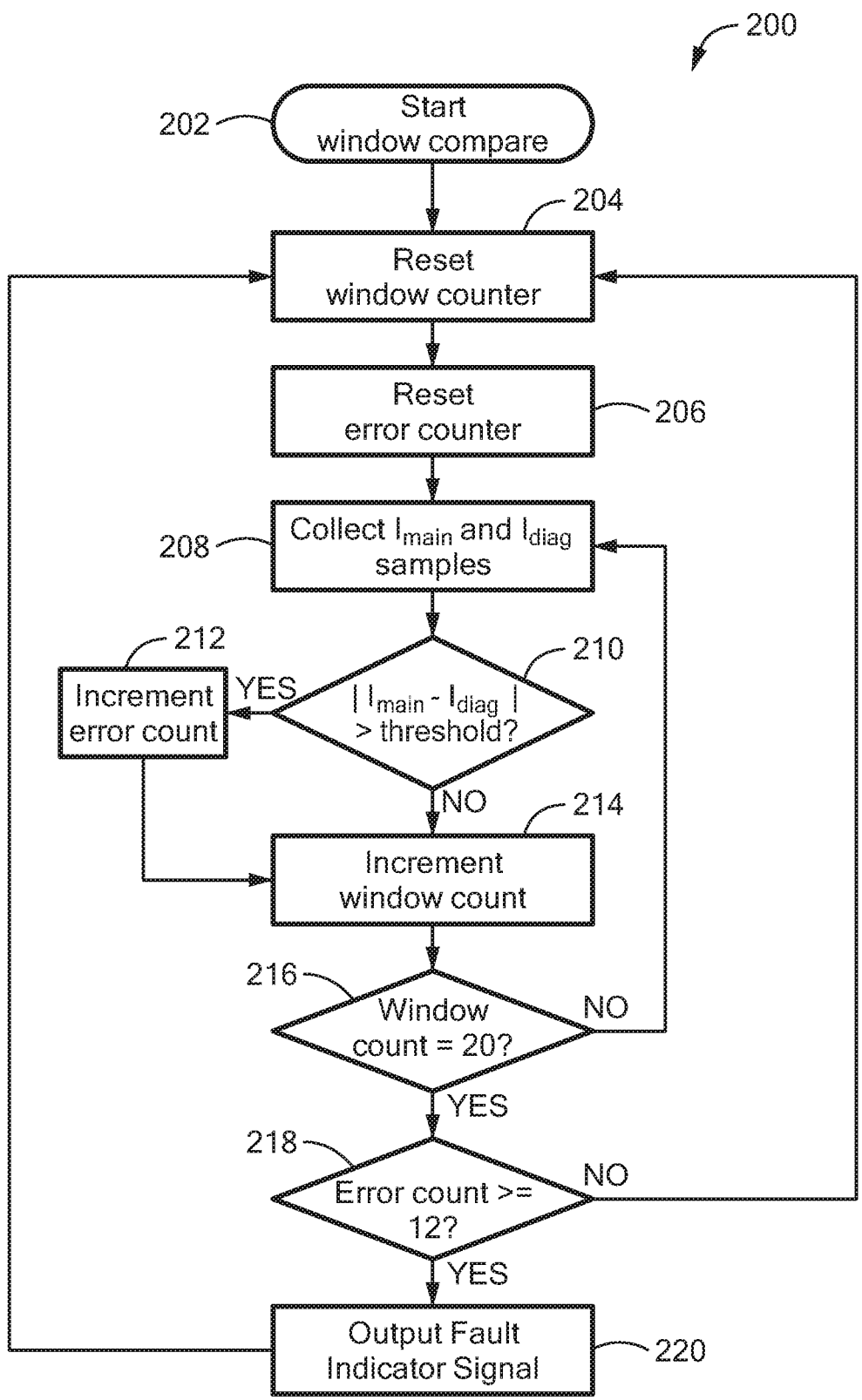
FIG. 3A illustrates a block diagram of a windowed comparison method.
Figure 3B:
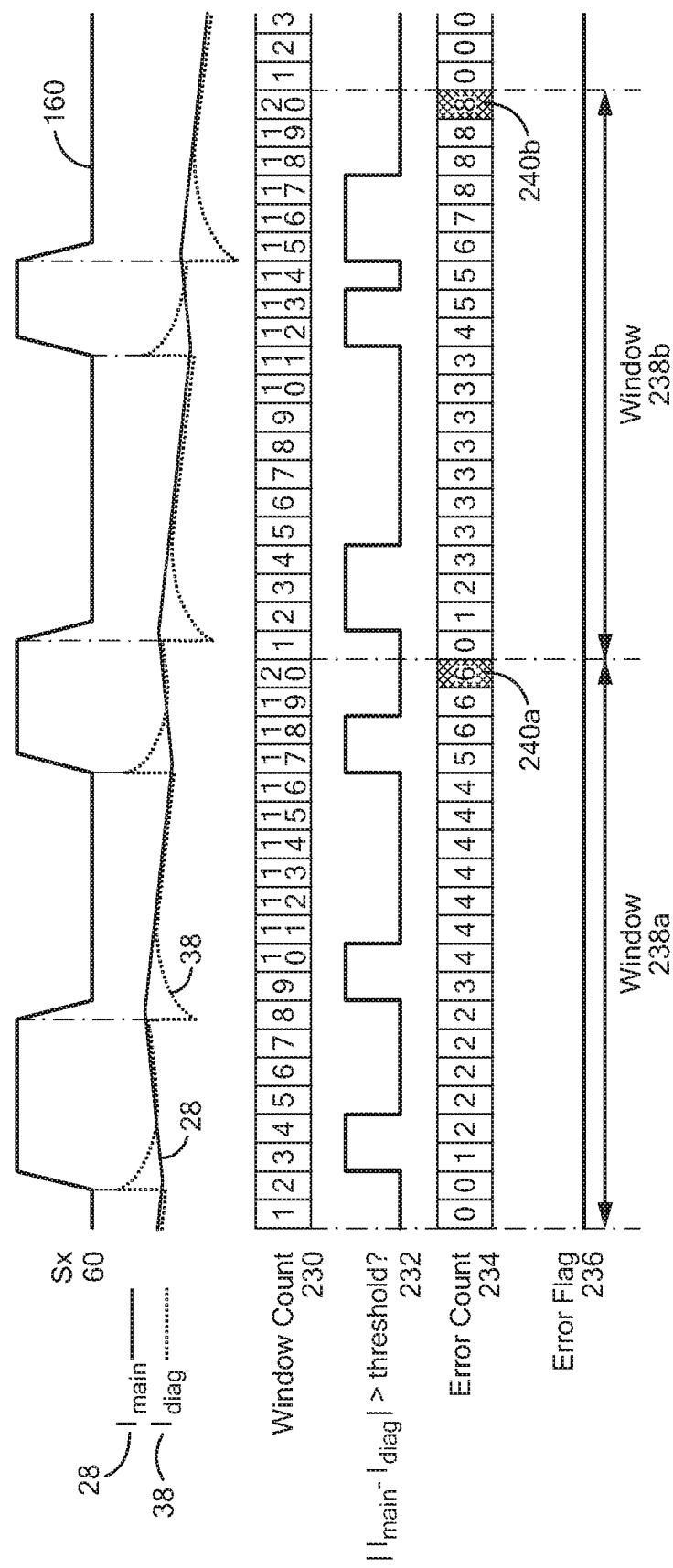
FIGS. 3B and 3C illustrate waveforms generated during a windowed comparison.
Figure 3C:
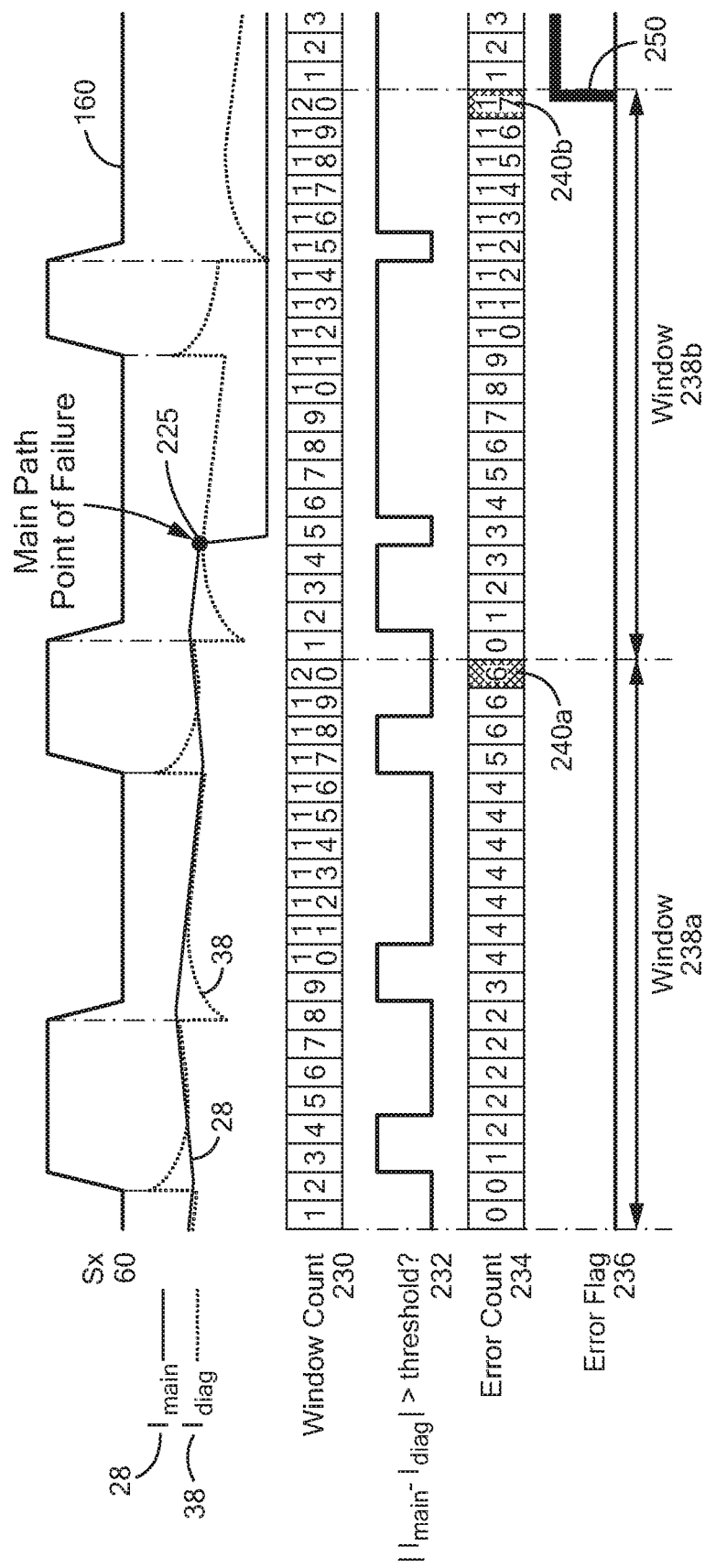
Figure 4A:
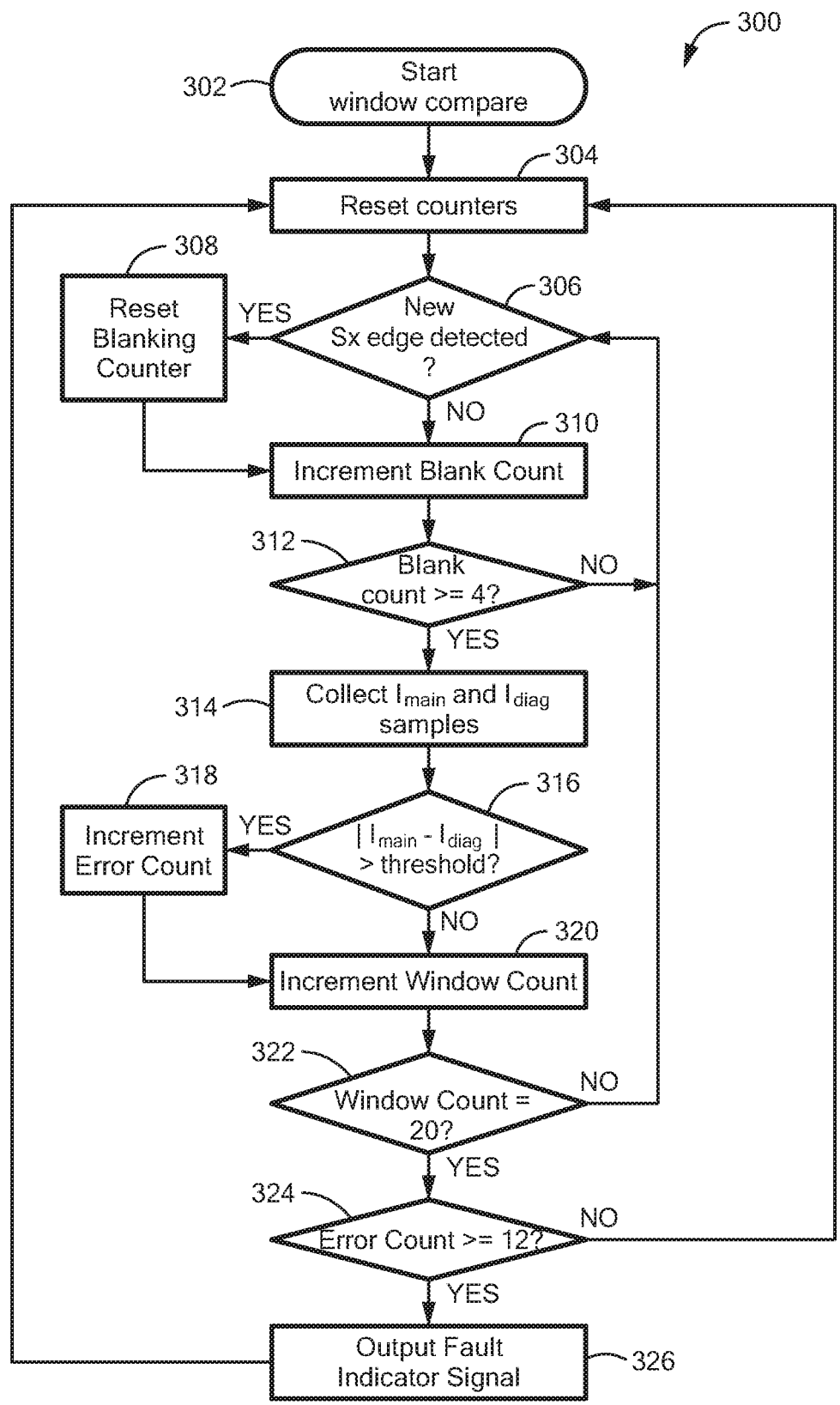
FIG. 4A illustrates a block diagram of a windowed comparison and comparison blanking method.
Figure 4B:
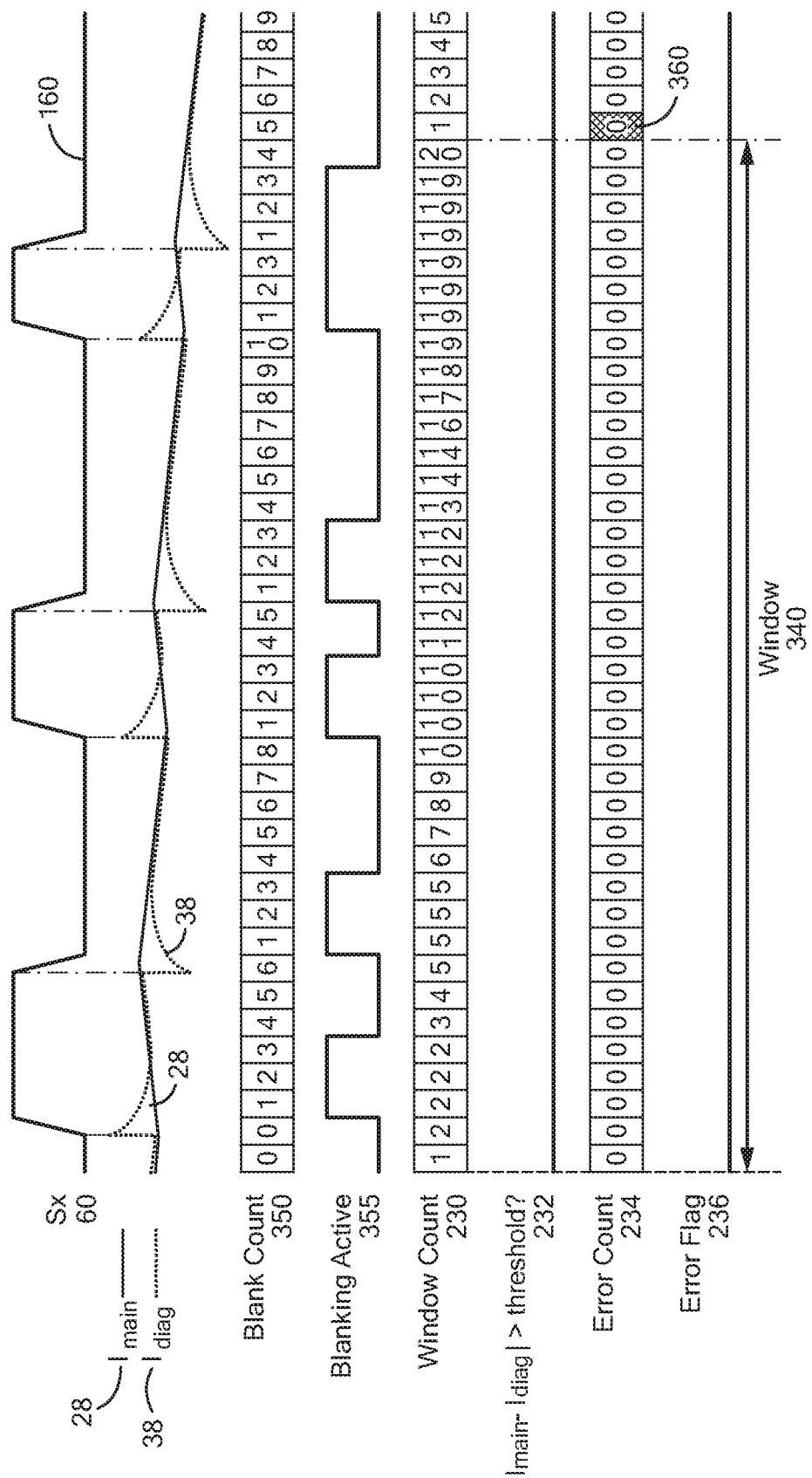
FIG. 4B illustrates a waveform generated during a windowed comparison and comparison blanking method.
Figure 5A:
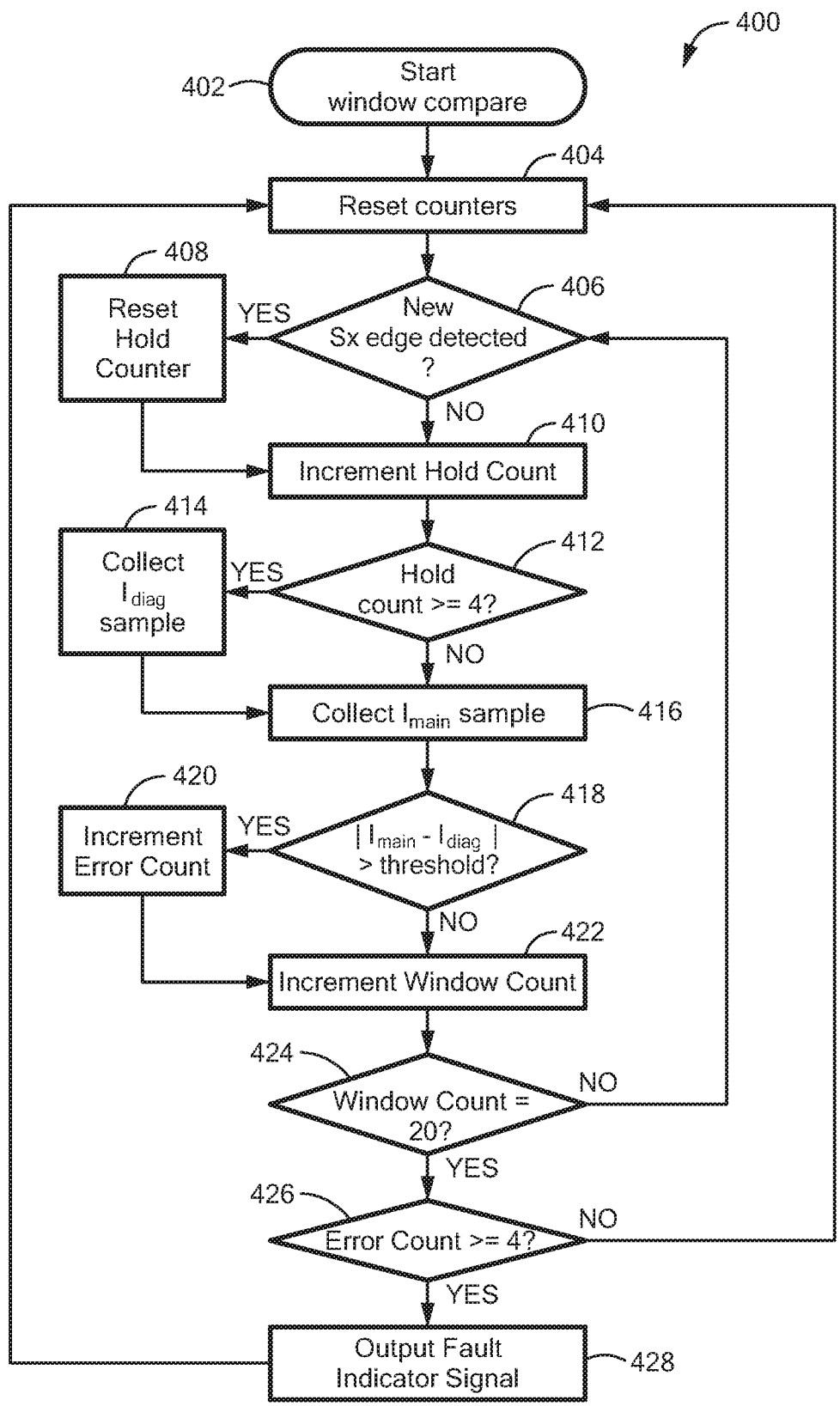
FIG. 5A illustrates a block diagram of a windowed comparison and diagnostic path holding method.
Figure 5B:
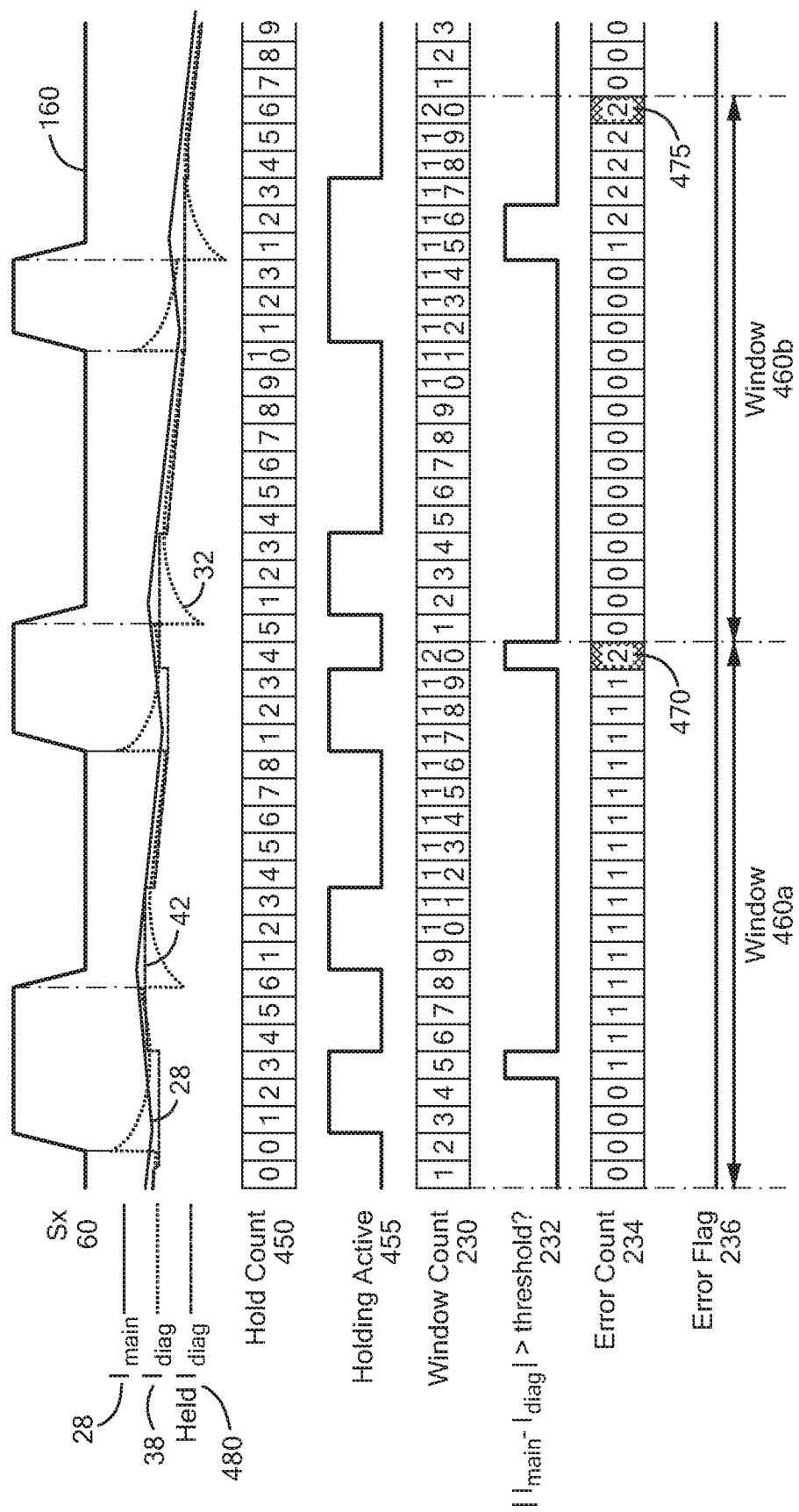
FIG. 5B illustrates a waveform generated during a windowed comparison and diagnostic path holding method.

The checker circuit 50 can be one or more circuits configured to compare two or more digital signals and implement the methods described herein, i.e. the windowed comparison method described in FIGS. 3A-3C, the windowed comparison and blanking method described in FIGS. 4A-4B, and the windowed comparison and diagnostic path holding method described in FIGS. 5A-5B. The methods described herein can be executed independently or in combination with such a combination being in series or in parallel. It should be appreciated that the checker circuit 50 can execute any method for comparing $I_{main}$ 28, $I_{diag}$ 38 to determine whether a fault occurred. In some embodiments, the checker circuit 50 can include one or more comparators, a counter and a plurality of logic gates. In other embodiments, the checker circuit 50 can include a microcontroller or microprocessor used in conjunction with other circuitry to carry out the methods described herein. The checker circuit 50 can interface with a memory 58 within the current sensor IC 10, and in some embodiments with a memory outside of the sensor IC 10.

Included in the checker circuit 50 is an error counter 52 that increments its value or error count when the checker circuit 50 identifies errors. An error can be generated when the absolute value of the difference between the first sampled signal from the main processing channel 20 and the second sampled signal from the diagnostic processing channel 30 exceeds or falls below a difference threshold. The error counter 52 can have an associated error threshold such that when the error counter 52 exceeds the error threshold, the checker circuit 50 outputs a fault signal such as the fault indicator signal 72. In some instances, the fault indicator signal 72 is output until the value of the error counter falls below the error threshold. The error counter 52 can be reset at the end of a window of time and regardless of whether a fault indicator signal 72 is issued and is reset by the setting the error count to zero. The error threshold and difference threshold can be programmable and, in some embodiments, programmable based an expected level of disturbances in the diagnostic processing channel 30.

Also included is a window counter 54 that increments to a window counter maximum to define a window of time. For example, a window of time that is ten cycles long has a window counter maximum of ten; the window counter 54 increments its value or window count until the window count exceeds the window counter maximum of ten. The window counter 54 can be reset at the end of a window of time by setting the window count 54 to zero. The length of the window of time, or the window counter maximum, can be programmable, and in some embodiments, programmable based on an expected level of disturbances in the diagnostic processing channel 30.

The checker circuit 50 further includes a blanking counter 56 that increments until a blanking counter threshold is reached. For example, a blanking period five cycles long has a blanking counter threshold of five; the blanking counter 56 increments its value or blank count until the blank count exceeds the blanking counter threshold of five. The blanking counter 56 is reset each time an edge is detected at node Sx 60, indicating that a common-mode transient event has occurred, and is reset by setting the blank count to zero. In some instances, the blanking period, or blanking counter threshold, can be established based on a voltage level of the input signal, i.e. $V_{INP}$ 62 and $V_{INN}$ 64.

Also included is a hold counter 55 that increments until a hold counter threshold is reached. For example, a diagnostic hold period four cycles long has a hold counter threshold of four; the hold counter 55 increments its value or hold count until the hold count exceeds the hold counter threshold of four. The hold counter 55 is reset each time an edge is detected at node Sx 60, indicating that a common-mode transient event has occurred, and is reset by setting the hold count to zero. In some instances, the diagnostic hold period, or hold counter threshold, can be established based on a voltage level of the input signal, i.e. $V_{INP}$ 62 and $V_{INN}$ 64. In still other embodiments, the blanking counter 56 can be used in place of the hold counter 55.

Further referring to FIG. 1, and in more detail, the sensor IC 10 can interface with a sensing element such as resistor $R_{sense}$ 15 which can be electrically connected in series between node Sx 60 and motor winding 74 to sense a current, $I_{motor}$ 66, through the motor winding 74. Current sensor 10 is configured to use $R_{sense}$ 15 to sense current $I_{motor}$ 66 for use by the motor driver 5 to control operation of the motor and generate a voltage input signal that is proportional to $I_{motor}$ 66 and that is passed to the main processing channel 20 and the diagnostic processing channel 30. The voltage across $R_{sense}$ 15 can be measured at connection nodes $V_{INP}$ 62 and $V_{INN}$ 64 which are further connected to the main amplifier 22 in the main processing channel 20, and the diagnostic (diag) amplifier 32 in the diagnostic processing channel 30. $R_{sense}$ 15 can be any resistor having any resistance value. In some embodiments, $R_{sense}$ 15 can have a resistance value of approximately 0.5 milliohms. In other embodiments, $R_{sense}$ 15 can have a resistance value less than 10 ohms but greater than 0.1 milliohms. $R_{sense}$ 15 can comprise one or more resistors coupled in parallel or in series to provide a resistor network that has a total resistance less than 100 ohms.

The main amplifier 22 amplifies the sensed voltage and passes the amplified voltage to an analog-to-digital converter (ADC) 24 in the main processing channel 20. Similarly, the diagnostic (diag) amplifier 32 amplifies the sensed voltage and passes the amplified voltage to an ADC 34 in the diagnostic processing channel 30. The main amplifier 22 and diag amplifier 32 can be any circuit or component able to amplify a voltage signal. In some instances, one or both the main amplifier 22 and the diag amplifier 32 can comprise a circuit with an operational amplifier or a transistor configured to amplify. The main amplifier 22 and the diag amplifier 32 can have different circuit architectures or comprise different circuit components and can have different operational requirements.

The amplifiers 22, 32 amplify the sensed voltage and pass the amplified voltage signal to the respective analog-to-digital converter (ADC) 24, 34. In the main processing channel 20, the main ADC 24 outputs a first digital signal that is delivered to a digital signal processing block 26 which removes noise from the signal and corrects the signal for analog circuit errors to generate a processed first digital signal $I_{main}$ 28. The first digital signal, $I_{main}$ 28, is sampled by the checker circuit 50 where it is compared against one or more additional digital signals. In the diagnostic processing channel 30, the diag ADC 34 outputs a second digital signal that is delivered to a digital signal processing block 36 which removes noise from the signal and corrects the signal for analog circuit errors. The second digital signal, $I_{diag}$ 38, is sampled by the checker circuit 50 where it is compared against $I_{main}$ 28, and in some instances, other digital signals. The main ADC 24 and the diag ADC 34 can have any circuitry configured to convert an analog signal to a digital signal. In some instances, the main ADC 24 and the diag ADC 34 can have different circuit architectures or comprise different circuit components and can have different operational requirements. Similarly, both digital signal processing blocks 26, 36 can include any circuitry or processing able to remove noise and otherwise process a digital signal. The main digital signal processing block 26 and the diag digital signal processing block 36 can have different circuit architectures or comprise different circuit components and can have different operational requirements.

Figure 2:
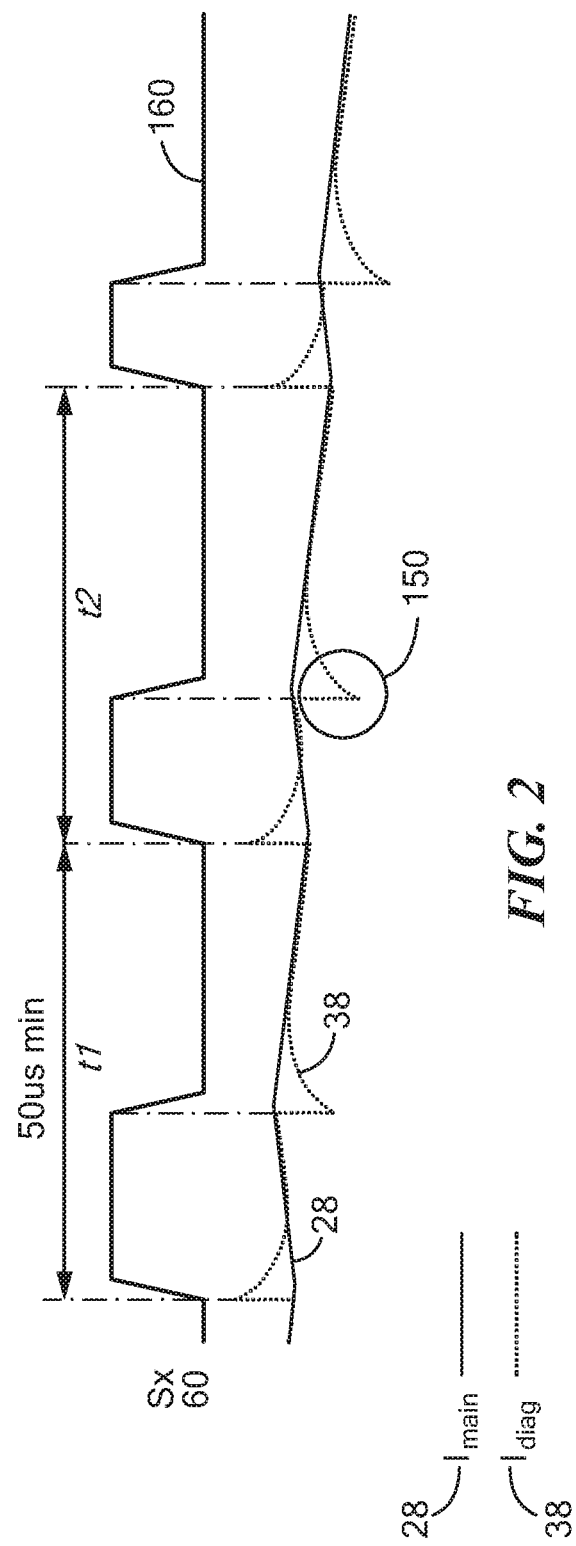
FIG. 2 illustrates a waveform of the current through the main processing channel and the diagnostic processing channel and the pulse width modulated (PWM) signal from the motor.

Illustrated in FIG. 2 are example waveforms including a voltage signal 160 at node Sx 60, an $I_{main}$ signal 28 and an $I_{diag}$ signal 38. The signal 160 at node Sx 60 results from PWM operation of the motor driver 5 and thus, can generally follow the PWM control signals that control the motor driver switches. The signal 160 has multiple periods, i.e. t1 and t2, as shown.

As is shown in FIG. 2, $I_{main}$ 28 is a relatively smooth signal with substantially no transient deviations due to edges at node Sx 60 and therefore high CMTI. $I_{diag}$ 38, however, is sensitive to edges of the signal 160 at node Sx 60 such that each time an edge occurs, there is a disturbance 150 in $I_{diag}$ 38 that is caused by the transition at node Sx 60. The sensitivity of the $I_{diag}$ 38 is a result of the lower CMTI of the diagnostic processing channel 30 and the diagnostic processing channel's inability to reject all common mode voltage transient voltages or changes in the common mode. These changes and/or transients in the signal 160 cause disturbances in $I_{diag}$ 38.

Illustrated in FIG. 3A is a windowed comparison method 200 that begins at step 202. Upon starting, the checker circuit 50 resets a window counter 54 (FIG. 1) (step 204) and an error counter 52 (FIG. 1) (step 206) and collects a sample of $I_{main}$ 28 (i.e. first sampled signal) and $I_{diag}$ 38 (i.e. second sampled signal) (step 208). The checker circuit 50 determines whether the absolute difference between the first sampled signal and the second sampled signal exceeds a difference threshold (step 210), and if the absolute difference exceeds the difference threshold then the error count, or value of the error counter 52, is incremented by one (step 212) and then the window count, or value of the window counter 54, is incremented by one (step 214). If the absolute difference falls below the difference threshold, then the window count, or value of the window counter 54, is incremented by one (step 214). The checker circuit 50 determines whether the window count exceeds a predetermined window counter maximum, such as twenty (step 216) and if not, repeats a portion of the method 200 starting with the collection of a new sample of $I_{main}$ 28 and a new sample of $I_{diag}$ 38 (step 208). Once the window count exceeds twenty, the checker circuit 50 determines whether the error count exceeds or is equal to a predetermined error count value such, such as twelve (step 218), and if the error count is less than twelve, the checker circuit 50 repeats method 200 by resetting the window counter 54 (step 204) and the error counter 52 (step 206). If the error count is greater than or equal to twelve, the checker circuit 50 outputs a fault indicator signal (step 220) and then repeats method 200 by resetting the window counter 54 (step 204) and the error counter 52 (step 206).

Further referring to FIG. 3A, the window counter 54 and the error counter 52 can be a variable stored in memory 58 that is incremented by a process executed by the checker circuit 50. In some embodiments, the counters 52, 54 can be a piece of hardware that is configured to store and increment a data value.

The checker circuit 50 collects samples of $I_{main}$ 28 and $I_{diag}$ 38 (step 208) by sampling the output from the main processing channel 20 and the diagnostic processing channel 30. The checker circuit 50 then calculates the absolute value of the difference between the first sampled signal from $I_{main}$ 28 and the second sampled signal from $I_{diag}$ 38 by executing a process and/or passing the first and second sampled signals through computational hardware. Once an absolute difference is calculated, the checker circuit 50 can then determine whether the absolute difference exceeds a difference threshold value (step 210). The difference threshold can be a fixed value or programmed into memory 58 by an end user. In some embodiments, the difference threshold can be a function of the first sampled signal and the second sampled signal. For example, the difference threshold can be increased from a nominal value if $I_{main}$ 28 or the first sampled signal exceeds a certain value such that the difference threshold is proportional to $I_{main}$ 28. It should be appreciated that the difference threshold can be any value suitable for detecting an error or fault in $I_{main}$ 28.

After comparing the two sampled signals and checking for errors, the checker circuit 50 increments a window count by one (step 214) and then determines whether the window count exceeds a window counter maximum of twenty (step 216). A window counter 54 increments and resets the window count and uses the window count to create window of time during which the checker circuit 50 checks for errors in $I_{main}$ 28. Resetting the window counter 54 restarts the window of time during which the two signals are compared to each other and errors are counted. The time period, or size, of the window can be modified by changing the window counter maximum. For example, FIGS. 3A-3C illustrate a window that is twenty cycles long (i.e. the window count reset when it exceeds the window counter maximum of twenty). This window counter maximum can be a number as low as one and as high as any number greater than one.

FIGS. 3A-3C illustrate an embodiment where the error count is a count of the number of error detections in a certain window of time. In other embodiments, a count of the number of samples that are error free or pass through the system during the window of time without an error can be used in place of the error count and in such embodiments, the count can be referred to alternatively as the "passing count". This error-free count can also comprise a count of the maximum number of consecutive samples that pass through without error during the window period. In this embodiment, error-free samples occur in continuous groups which facilitates detecting a failure that could cause the main processing channel 20 to rapidly or randomly oscillate. Furthermore, in such embodiments using a passing count, a fault indicator signal can be generated and output (step 326) when the count falls below a threshold (step 324) specifying the minimum number of error-free, or passing samples required during a time window (i.e., when the count fails to reach the threshold within the time window). For example, if a functional system expects to process at least three hundred error-free samples during a time window, then the threshold would be three hundred. In this example, a fault signal is output when the count fails to exceed the threshold value at the end of the time window.

The checker circuit 50 determines whether the error count is greater than or equal to an error threshold, such as a threshold of twelve (step 324). An error counter 52 increments and resets the error count. The error count value can be any number as low as one and as high as any number greater than one. For example, FIGS. 3A-3C illustrate a system that has an error threshold of twelve. When that error count value is met or exceeded, the checker circuit 50 outputs a fault indicator signal (step 326) that signals to the system that a fault has occurred.

Both the window counter value and the error counter value can be hard coded into the hardware or programmed into memory 58 during manufacturing or by a user. The values of the window counter maximum and error threshold can be chosen based on the level of CMTI expected from the diagnostic processing channel 30. In some instances, a user can calibrate the system's sensitivity to errors by modifying the window counter maximum and the error threshold.

FIGS. 3B-3C include example waveforms to illustrate the windowed comparison method 200 of FIG. 3A. FIG. 3B illustrates waveforms generated when no failures are detected in the main processing channel 20, while FIG. 3C illustrates waveforms generated when one or more failures or faults are detected in the main processing channel 20. Both figures illustrate windows 238a-b and waveforms of $I_{main}$ 28, $I_{diag}$ 38 and the signal 160 at node Sx 60. Also shown in FIGS. 3B and 3C is a window count 230, error count 234, a waveform illustrating a determination of whether the absolute value of $I_{main}$-$I_{diag}$ is greater than the difference threshold 232, and a waveform illustrating an error flag 236. The waveform in FIG. 3C illustrates an $I_{main}$ 28 signal that has a point of failure 225.

Further referring to FIG. 3B and in more detail, shown are waveforms generated when no fault is detected on the first sampled signal, i.e. $I_{main}$ 28. At the end of the first window 238a, the error count 240a is six (i.e., the error counter 52 is incremented at each edge of the signal 232 when the absolute different between $I_{main}$ 28 and $I_{diag}$ 38 exceed the difference threshold). Although errors are detected during the first window 238a, the number of errors does not exceed the error threshold of twelve and so the checker circuit 50 does not generate a positive fault indicator signal 72. Similarly, at the end of the second window 238b, the error count 240b is eight and therefore does not exceed the error threshold of twelve, so the checker circuit 50 does not generate a positive fault indicator signal 72. The error flag 236 waveform remains flat and therefore reflects that no positive fault indicator signal 72 was generated during the first or second window 238a-b.

Further referring to FIG. 3C and in more detail, shown are waveforms generated when a failure is detected on the first sampled signal, i.e. $I_{main}$ 28, indicated by a sharp deviation in signal Imain 28 from the signal Idiag 38 during the times of no disturbances. At the end of the first window 238a, the error count 240a is six and so a fault indicator signal 72 is not generated because the error count does not exceed the error threshold of twelve. During the second window 238b, however, the first sampled signal experiences a failure 225. Accordingly, the error count 240b during window 238b is seventeen and therefore exceeds twelve. In response, the checker circuit 50 generates a positive fault indicator signal 72. The failure of the first sampled signal is illustrated on the error flag waveform 236 at the edge 250 where the waveform goes high indicating a failure occurred. Although not shown, the error flag waveform 236 will remain high until the completion of a window time period during which the error count is less than the error threshold.

Illustrated in FIG. 4A is a windowed comparison and blanking method 300 that begins at step 302. Upon starting, the checker circuit 50 resets all counters (step 304) and starts the blanking process by determining whether the edge detector 40 (FIG. 1) detected an edge of the signal 160 (FIG. 2) at node Sx 60 (step 306). If an edge was detected, then a blanking counter 56 (FIG. 1) is reset (step 308). However, if no edge was detected then the value of the blanking counter 56, or the blank count, is incremented by one (step 310) and the checker circuit 50 determines whether the blank count is greater than or equal to a predetermined blanking counter threshold, such as four (step 312). If the blank count is not greater than or equal to four, then the checker circuit 50 repeats the process starting with a determination as to whether an edge was detected at node Sx 60 (step 306). If the blank count is greater than or equal to four, then the checker circuit 50 begins the windowed comparison process by collecting a sample of $I_{main}$ 28 (i.e. first sampled signal) and $I_{diag}$ 38 (i.e. second sampled signal) (step 314). The checker circuit 50 then determines whether the absolute difference between the first sampled signal and the second sampled signal exceeds a predetermined difference threshold (step 316). If the absolute difference exceeds the difference threshold, then the error counter 52 is incremented by one (step 318) and the window counter 54 is incremented by one (step 320). If the absolute difference falls below the predetermined threshold, then the window counter 54 is incremented by one (step 320). The checker circuit 50 then determines whether the window counter value exceeds twenty (step 322) and if the window counter value does not exceed twenty, the checker circuit 50 repeats the blanking process by determining if an edge was detected at node Sx 60 (step 306).

Once the window count reaches a count of twenty, then the checker circuit 50 determines whether the error count exceeds or is equal to twelve (step 324), and if the error count is less than twelve, the checker circuit 50 repeats the entire method 300 by resetting all counters 52, 54, 56 (step 304). If the error count is greater than or equal to twelve, the checker circuit 50 outputs a fault indicator signal (step 326) and then repeats the entire method 300 by resetting all counters 52, 54, 56 (step 304).

Further referring to FIG. 4A, the blank count, window count and error count can be values stored in memory 58 that are incremented and reset to zero by a blanking counter 56, window counter 54 and error counter 52, respectively. These counters can be processes executed by the checker circuit 50 or hardware that is configured to store and increment a data value.

The edge detector 40 (FIG. 1) detects whether an edge occurs at node Sx 60 by sampling the potential at that node. The checker circuit 50 halts or suspends error detection during a blanking period when a pulse edge is detected by halting comparisons, resetting a blank count (308) and incrementing that blank count (steps 310 and 312) for a count of four cycles. As discussed previously, $I_{diag}$ 38 experiences disturbances resulting from the transitions of node Sx 60 during the start and end of a pulse, therefore to further ignore or filter out these disturbances, the process 300 avoids comparing $I_{diag}$ 38 and $I_{main}$ 28 for a blanking time period, i.e. the period of time which starts when an edge is detected (step 306) and ends when the blank count exceeds the blanking counter threshold, i.e. four cycles. Once the checker circuit 50 determines that the blank count exceeds the blanking counter threshold, the checker circuit 50 resumes comparison of the diagnostic processing path 30 output and the main processing path 20 output by performing the comparison portion of the windowed comparison method 200 illustrated in FIG. 3A. It should be appreciated that while FIG. 4A describes a blanking counter threshold of four, the blanking counter threshold can be any number of cycles needed for the diagnostic processing path 30 to normalize.

In some embodiments, comparison can be halted using methods other than using the edge detector 40 operating on node Sx 60. For example, external signals such as motor driver logic input PWM signals, may be available to anticipate the occurrence of an edge of a pulse at node Sx 60. In this example, the motor driver logic input signals could be used to halt or suspend comparison of $I_{diag}$ 38 and $I_{main}$ 28 for a period of time. In another example, the checker circuit 50 could infer or predict when pulse edges at node Sx 60 occur using information from the diagnostic processing path 30 such as $I_{diag}$ 38. In this example, once the checker circuit 50 infers a pulse edge is occurring, the checker circuit 50 can halt comparison of $I_{diag}$ 38 and $I_{main}$ 28 for a period of time.

As is the case in FIG. 3A, after comparing the two sampled signals and checking for errors, the checker circuit 50 increments a window counter value by one (step 320) and then determines whether the window count exceeds a window counter maximum (step 322). Here, the checker circuit 50 repeats the comparison blanking process by determining whether a pulse edge is or was detected at node Sx 60 (step 306) until the window counter maximum is met (step 322).

While FIG. 4A illustrates the combined use of comparison blanking and windowed comparison, in some embodiments, comparison blanking can be used independently such that the checker circuit 50 outputs a fault indicator signal 72 (FIG. 1) (step 326) for a single set of samples whose difference exceeds the difference threshold. Using comparison blanking independently requires configuring the window time period to be one by specifying that the window counter maximum is one, and by setting the error count threshold to one so that a single error will trip or otherwise cause the output of a fault indicator signal 72.

FIG. 4B includes example waveforms to illustrate the windowed comparison and blanking method 300 described in FIG. 4A. Illustrated are waveforms for the output of both processing channels $I_{main}$ 28, $I_{diag}$ 38, and the signal 160 at node Sx 60. Also shown is the window count 230, error count 234, a waveform illustrating a determination of whether the absolute value of $I_{main}-I_{diag}$ is greater than the difference threshold 232, and a waveform illustrating an error flag 236. A single window 340 is demonstrated as is the sample 360 where the new window begins.

A blank count 350 and a waveform indicating when the blank count 350 is less than four, i.e. the blanking active 355 waveform, demonstrate how the value of the blanking counter 36 impacts the window count 230. When the blank count 350 is less than four, or when blanking active 355 is high or active, the window count 230 is suspended and does not increment. For example, as demonstrated in FIG. 4B, for the first five blank counts 350 "0, 0, 1, 2, 3", the corresponding window count 230 is "1, 2, 2, 2, 2". The window count 230 remains halted at "2" when the blank count 350 is less than four. When the blank count 350 is four or greater, such as for the next three samples, "4, 5, 6", the window count 230 increments and has the values "3, 4, 5". After the blank count 350 of "6", the blanking counter 56 is reset and the next blank count 350 is "1". The corresponding window count 230 holds its previous value of "5" because the blank count 350 is less than four.

No comparisons during window 340 yield an error flag and so the error flag 236 waveform remains at zero. In the example illustrated in FIG. 4B, the blanking counter threshold of four was chosen to be longer than the settling time of the diagnostic processing path 30 disturbances, therefore even though $I_{diag}$ 38 experienced disturbances, no errors were flagged because comparisons were halted until the diagnostic processing path 30 settled and normalized. The combination method 300 of the blanking method and windowed comparison method (FIG. 4A) has the effect of decreasing the optimal error threshold to a low value. Doing this can be desirable to increase fault coverage or to detect short-duration failures.

The windowed comparison method 200 described in FIG. 3A and the windowed comparison with comparison blanking method 300 described in FIG. 4A may not catch failures that compromise the CMTI of the main processing channel 20 because certain samples in the main processing channel 20 are ignored for comparison. For example, in the windowed comparison method 200, such CMTI-dependent failures may be ignored because the readings may be so brief that the error count never exceeds the error threshold, while in the windowed comparison with comparison blanking method 300, these errors may be ignored during a blanking period. While components within the main processing channel 20 are configured to stabilize the main processing path 20 in the presence of large input common mode transient voltages, these components may fail, and the main processing path 20 could briefly experience faults only at input common mode transient edges.

The windowed comparison and diagnostic path holding method 400 illustrated in FIG. 5A makes a comparison for every sample processed by the main processing channel 20 and therefore detects CMTI-dependent failures in the main processing channel 20. The method 400 begins at step 402. Upon starting, the checker circuit 50 resets all counters (step 404) and starts the diagnostic path holding process by determining whether the edge detector 40 detected an edge of the signal 160 (FIG. 2) at node Sx 60 (step 406). If an edge is detected, then a hold counter 55 (FIG. 1) is reset (step 408) and subsequently incremented by one (step 410). However, if no edge was detected then the hold counter 55 is incremented by one (step 410). The checker circuit 50 then determines whether the value of the hold counter 55, or the hold count, is greater than or equal to a predetermined hold counter threshold, such as four (step 412). If the hold count is greater than or equal to four, the checker circuit 50 collects a sample of $I_{diag}$ 38 (step 414) and collects a sample of $I_{main}$ 28 (step 416). If the hold count is less than four, then the checker circuit 50 collects the sample of $I_{main}$ 28 (step 416). The checker circuit 50 then determines whether the absolute difference between $I_{main}$ 28 and $I_{diag}$ 38 is greater than a difference threshold (step 418). If the absolute difference is greater than the difference threshold (step 418) an error count is incremented (step 420) and a window count is incremented (step 422), however if the difference is less than the threshold (step 418), only a window count may be incremented (step 422). The checker circuit 50 then determines whether the window count has reached twenty (step 424) and if the window count has not reached twenty, the checker circuit 50 repeats the diagnostic path holding process by determining if an edge was detected at node Sx 60 (step 406). Once the window count reaches twenty, the checker circuit 50 determines whether the error count exceeds or is equal to four (step 426), and if the error count is less than four, the checker circuit 50 repeats the entire method 400 by resetting all counters (step 404). If the error count is greater than or equal to four, the checker circuit 50 outputs a fault indicator signal 72 (FIG. 1) (step 428) and repeats the entire method 400 by resetting all counters (step 404).

Further referring to FIG. 5A, the hold count, window count and error count can be values stored in memory 58 that are incremented and reset to zero by a holding counter 55, window counter 54 and error counter 52, respectively. These counters can be processes executed by the checker circuit 50, or hardware that is configured to store and increment a data value. In some embodiments, the windowed comparison and diagnostic path holding method 400 can be carried out using the blanking counter 56 in place of the hold counter 55.

Similar to the windowed comparison with comparison blanking method 300, the windowed comparison and diagnostic path holding method 400 holds the diagnostic processing channel 30 when the checker circuit 50 detects a pulse edge at node Sx 60. As was the case with the blanking process, when an edge is detected at Sx 60 (step 406), a hold counter 55 is reset (step 408) and the diagnostic hold process begins by incrementing the hold count (step 410). The checker circuit 50 detects the edge at Sx 60 by sampling the diagnostic hold signal 42 output by the edge detector 40 and samples the potential at the node 60. When the edge detector 40 detects an edge of a signal at node Sx 60, the edge detector 40 can modify the diagnostic hold signal 42 to reflect the detected edge.

When a new Sx edge is detected and the hold counter is reset (steps 406 and 408), the checker circuit 50 avoids collecting $I_{diag}$ 38 samples, effectively holding the previous sample for the diagnostic hold period (until the hold count is greater than or equal to the hold counter threshold, which in this example is four). During the diagnostic hold period, and while the hold count is less than four, the checker circuit 50 collects an $I_{main}$ 28 sample (step 416) and compares it against the stored $I_{diag}$ 38 value (step 418). In some instances, the stored $I_{diag}$ 38 value was obtained during that cycle (step 414), in other instances the stored $I_{diag}$ 38 value was obtained in one of the previous three cycles. This method 400, relies on the fact that the input current (i.e. $I_{motor}$ 66) does not substantially change during the diagnostic hold period because the motor current, $I_{motor}$ 66, in typical motor control applications changes slowly relative to a period of the PWM motor driver signals and thus, also a period of the voltage at node Sx 60.

After the checker circuit 50 collects a sample of $I_{main}$ 28, the method 400 carries out the windowed comparison method 200 described in FIG. 3A except that when the window count exceeds twenty (step 424), the checker circuit 50 determines whether a pulse edge was detected at node Sx 60 (step 406). The hold process then restarts when the hold count is reset (step 408) and then incremented (step 410) until it exceeds a hold count threshold. It should be appreciated that while FIG. 5A illustrates a hold count threshold of four, the hold count threshold can be any number able to create a hold period that allows the diagnostic processing path 30 to normalize.

FIG. 5B includes example waveforms to illustrate the windowed comparison with diagnostic path holding method 400 described in FIG. 5A. Illustrated are waveforms for the output of both processing channels $I_{main}$ 28, $I_{diag}$ 38, and the signal 160 at node Sx 60. Also shown is the window count 230, error count 234, a waveform illustrating the determination of whether the absolute value of $I_{main}$-$I_{diag}$ is greater than the difference threshold 232, and a waveform of an error flag 236. Two windows 460a-b are demonstrated along with errors 470, 475 in each window.

Also demonstrated in FIG. 5B is a held version of $I_{diag}$ 38, Held $I_{diag}$ 480, that illustrates how the use of a previous $I_{diag}$ 38 signal during the diagnostic hold period alters the original $I_{diag}$ 38 signal to create a signal with fewer disturbances. In the process 400 illustrated in FIG. 5A, the checker circuit 50 compares $I_{main}$ 28 to the Held $I_{diag}$ 480 signal. Also illustrated is hold count 450 and a waveform, i.e. holding active 455, illustrating when the diagnostic hold period is active (when the hold count is less than four). Unlike in the windowed comparison with comparison blanking method 300, in this method 400 the window count 230 continues to increment when the diagnostic hold period 455 is active, i.e. when the hold count 450 is less than the hold counter threshold. Instead, in this method, the $I_{diag}$ 38 signal is held during the diagnostic hold period 455 as demonstrated by Held $I_{diag}$ 480.

As stated earlier, the slow movement of $I_{motor}$ 66 relative to the Sx node 60 voltage causes $I_{main}$ 28 to vary only slightly from Held $I_{diag}$ 480 signal. Therefore, there are only a few comparison errors. In the first window 460a there are two errors 470, and in the second window 460b there are two errors 475. The error threshold for this method 400 can be reduced, i.e. from twelve to four in these exemplary embodiments, because of the relatively slight deviation between $I_{main}$ 28 and Held $I_{diag}$ 480. To remove window comparison, the window counter maximum and the error threshold can be set to one.

In some embodiments, the previous $I_{diag}$ 38 value can be held using other methods. For example, external signals such as motor driver logic input signals, may be available to anticipate the occurrence of an edge of a pulse at node Sx 60. In this example, the motor driver logic input signals could be used to hold the $I_{diag}$ 38 value for a period of time. In another example, the checker circuit 50 could infer or predict when pulse edges at node Sx 60 are occurring using information from the diagnostic processing path 30 such as $I_{diag}$ 38. In this example, once the checker circuit 50 infers a pulse edge is about to occur, the checker circuit 50 can hold the $I_{diag}$ 38 value for a period of time.

It should be appreciated that the circuit architectures and methods described herein are merely embodiments of the system for comparing signals from processing channels with different responses to disturbances, and that aspects of this system can be modified while maintaining the function of the system. All publications and references cited herein are expressly incorporated by reference in their entirety.

What is claimed is:

1. A sensor integrated circuit for detecting a fault comprising:
   a main processing channel responsive to an input signal from a sensing element to generate a first processed signal, wherein the main processing channel has a first response to disturbances;
   a diagnostic processing channel responsive to the input signal to generate a second processed signal, wherein the diagnostic processing channel has a second response to disturbances larger than the first response; and
   a checker circuit responsive to the first processed signal and the second processed signal and configured to detect a fault in the sensor integrated circuit and generate a fault signal indicative of the fault when the first processed signal and the second processed signal differ from each other by more than a predetermined amount.

2. The sensor integrated circuit of claim 1 wherein the disturbances comprise common mode input changes.

3. The sensor integrated circuit of claim 1 wherein the sensing element is configured to sense a parameter and generate the input signal for coupling to the main processing channel and to the diagnostic processing channel.

4. The sensor integrated circuit of claim 3 wherein the sensing element comprises a resistor and the parameter comprises a current.

5. The sensor integrated circuit of claim 1 wherein the main processing channel has a first latency, and the diagnostic processing channel has a second latency greater than the first latency.

6. The sensor integrated circuit of claim 1 wherein the main processing channel has a first latency, and the diagnostic processing channel has a second latency substantially similar to the first latency.

7. The sensor integrated circuit of claim 1 wherein the input signal is an analog signal, main processing channel comprises a first analog-to-digital converter configured convert the analog signal into a first digital signal and the diagnostic processing channel comprises a second analog-to-digital converter configured to convert the analog signal into a second digital signal.

8. The sensor integrated circuit of claim 7 wherein the checker circuit comprises a first sample circuit configured to sample the first digital signal and generate a first sampled signal, a second sample circuit configured to process the second digital signal and generate a second sampled signal, and a comparator configured to compare the first sampled signal to the second sampled signal.

9. The sensor integrated circuit of claim 8 wherein the comparator is configured to determine, within a predetermined window of time, whether an absolute difference between the second sampled signal and the first sampled signal exceeds a difference threshold.

10. The sensor integrated circuit of claim 9 wherein the checker circuit comprises an error counter that increments each time the absolute difference exceeds the difference threshold, and outputs the fault signal when the error counter exceeds an error threshold.

11. The sensor integrated circuit of claim 10 wherein one or more of the predetermined windows of time, the difference threshold, or the error threshold is programmable based on an expected level of the disturbances.

12. The sensor integrated circuit of claim 9 wherein the checker circuit comprises a counter that increments each time the absolute difference falls below the difference threshold, and outputs the fault signal if the counter fails to exceed a threshold.

13. The sensor integrated circuit of claim 9 wherein the checker circuit comprises an error counter that increments each consecutive time the absolute difference exceeds the difference threshold, and outputs the fault signal until the error counter exceeds an error threshold.

14. The sensor integrated circuit of claim 10 wherein the comparator is configured to suspend determining whether the absolute difference between the second sampled signal and the first sampled signal exceeds the difference threshold during a blanking period.

15. The sensor integrated circuit of claim 14 wherein the blanking period is established based on a voltage level of the input signal.

16. The sensor integrated circuit of claim 15 further comprising:
   an input signal indictor configured to provide an indication of edges of the input signal; and
   a blanking counter configured to increment in response to the edge indication, wherein the blanking period commences in response to detection of a predetermined number of edge indications.

17. The sensor integrated circuit of claim 16 wherein the input signal indicator comprises at least one of an edge detector coupled to receive the input signal and configured to detect edges of the input signal to provide the indication, and external signal, or the second processed signal.

18. The sensor integrated circuit of claim 8 wherein the checker circuit is configured to suspend generating the second sampled signal and to hold a value of the second sampled signal during a hold period.

19. The sensor integrated circuit of claim 18 wherein the comparator is configured to determine, during the hold period, whether an absolute difference between the held value of the second sampled signal and the first sampled signal exceeds a difference threshold.

20. The sensor integrated circuit of claim 19 further comprising:
   an input signal indictor configured to provide an indication of edges of the input signal; and
   a holding counter configured to increment in response to the edge indication, wherein the hold period ends in response to detection of a predetermined number of edge indications.

21. The sensor integrated circuit of claim 20 wherein the input signal indicator comprises at least one of an edge detector coupled to receive the input signal and configured to detect edges of the input signal to provide the indication, and external signal, or the second processed signal.

22. A method for detecting a fault in a sensor integrated circuit comprising:
   generating, by a main processing channel, a first processed signal responsive to an input signal from a sensing element, wherein the main processing channel has a first response to disturbances;
   generating, by a diagnostic processing channel, a second processed signal responsive to the input signal, wherein the diagnostic processing channel has a second response to disturbances larger than the first response;
   detecting a fault in the sensor integrated circuit responsive to the first processed signal and the second processed signal; and
   generating a fault signal indicative of the fault when the first processed signal and the second processed signal differ from each other by more than a predetermined amount.

23. The method of claim 22 wherein the disturbances are common mode input changes.

24. The method of claim 22 wherein detecting the fault further comprises detecting the fault using a checker circuit; and generating the fault signal further comprises generating the fault signal using the checker circuit.

25. The method of claim 24 further comprising:
   converting an analog signal input into the main processing channel to a first digital signal;
   converting an analog signal input into the diagnostic processing channel to a second digital signal;
   sampling, by the checker circuit, the first digital signal to generate a first sampled signal;
   sampling, by the checker circuit, the second digital signal to generate a second sampled signal; and
   comparing the first digital signal to the second digital signal to generate the fault signal.

26. The method of claim 25 further comprising:
   determining during a predetermined window of time whether an absolute difference between the second sampled signal and the first sampled signal exceeds a difference threshold;
   incrementing an error counter each time the absolute difference exceeds the difference threshold; and
   outputting the fault signal when the error counter exceeds an error threshold.

27. The method of claim 26 further comprising suspending determination of whether the absolute difference between the second sampled signal and the first sampled signal exceeds the difference threshold during a blanking period.

28. The method of claim 25 further comprising:
   suspending generating the second sampled signal and holding a value of the second sampled signal during a hold period; and
   determining during the hold period whether an absolute difference between the held value of the second sampled signal and the first sampled signal exceeds a difference threshold,
   wherein the hold period corresponds to a predetermined number of edge indications provided by an input signal indicator.

29. A sensor integrated circuit comprising:
   means for generating a first processed signal responsive to an input signal provided to a main processing channel;
   means for generating a second processed signal responsive to the input signal provided to a diagnostic processing channel;
   means for detecting a fault in the sensor integrated circuit responsive to the first processed signal and the second processed signal; and
   means for generating a fault signal indicative of the fault when the first processed signal and the second processed signal differ from each other by more than a predetermined amount.

30. The sensor integrated circuit of claim 29 wherein the means for generating the first processed signal comprises the main processing channel having a first response to common mode input changes, and the means for generating the second processed signal comprises the diagnostic processing channel having a second response to common mode input changes larger than the first response.

* * * * *